United States Patent
Lin et al.

(10) Patent No.: US 10,147,672 B2
(45) Date of Patent: Dec. 4, 2018

(54) LEAD FRAME SURFACE MODIFICATIONS FOR HIGH VOLTAGE ISOLATION

(71) Applicant: Texas Instruments Incorporated, Dallas, TX (US)

(72) Inventors: Yong Lin, Plano, TX (US); Sadia Arefin Khan, Addison, TX (US); Benjamin Stassen Cook, Rockwall, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/133,857

(22) Filed: Apr. 20, 2016

(65) Prior Publication Data
US 2017/0309553 A1    Oct. 26, 2017

(51) Int. Cl.
*H01L 23/495* (2006.01)
*H01L 23/31* (2006.01)
*H01L 21/48* (2006.01)
*H01L 21/56* (2006.01)

(52) U.S. Cl.
CPC .... *H01L 23/49558* (2013.01); *H01L 21/4842* (2013.01); *H01L 21/565* (2013.01); *H01L 23/3114* (2013.01); *H01L 23/49541* (2013.01); *H01L 2224/48247* (2013.01); *H01L 2224/97* (2013.01); *H01L 2924/181* (2013.01)

(58) Field of Classification Search
None
See application file for complete search history.

(56) References Cited

U.S. PATENT DOCUMENTS

| | | | | |
|---|---|---|---|---|
| 5,031,022 A | * | 7/1991 | Yamamoto | H01L 23/49572 257/667 |
| 5,283,717 A | * | 2/1994 | Hundt | H01L 23/3107 174/255 |
| 5,616,953 A | * | 4/1997 | King | H01L 23/4951 257/666 |
| 5,841,187 A | * | 11/1998 | Sugimoto | H01L 23/49541 257/666 |
| 6,476,476 B1 | * | 11/2002 | Glenn | H01L 23/13 257/686 |
| 2010/0065963 A1 | * | 3/2010 | Eldridge | B23K 20/004 257/734 |
| 2013/0200397 A1 | * | 8/2013 | Biwa | H01L 31/173 257/82 |
| 2016/0064253 A1 | * | 3/2016 | Kumamoto | H01L 23/49582 438/123 |

OTHER PUBLICATIONS

"3D Printing", Wikipedia, available at http://en.wikipedia.org/w/index.php?title=3D_printing&oldid=624190184, Sep. 4, 2014, pp. 1-35.

* cited by examiner

*Primary Examiner* — Michelle Mandala
(74) *Attorney, Agent, or Firm* — Michael A. Davis, Jr.; Charles A. Brill; Frank D. Cimino

(57) ABSTRACT

An integrated circuit (IC) includes a lead frame that has a set of leads coupled to a corresponding set of pins. A semiconductor die with contacts is coupled to the set of leads. Encapsulating material encloses the semiconductor die, such that the set of pins extend beyond the encapsulating material. An additive coating covers one or more of the plurality of pins.

17 Claims, 4 Drawing Sheets

LEAD FRAME SURFACE MODIFICATIONS FOR HIGH VOLTAGE ISOLATION

FIELD OF THE INVENTION

This disclosure relates to integrated circuits that are intended for high voltage applications, and in particular to creepage between pins of the integrated circuit caused by the high voltage.

BACKGROUND OF THE INVENTION

Voltage induced creepage and pin to pin clearance of an integrated circuit (IC) is critical for high voltage and isolation products. Creepage distance is the shortest distance separating two conductors as measured along an insulating surface touching both conductors. The Institute for Interconnecting and Packaging Electronic Circuit (IPC) has promulgated a standard entitled "Generic Standard on Printed Board Design" IPC2221A, May 2003, which is intended to provide information on the generic requirements for organic printed board designs.

Creepage distance and clearance is critical for high voltage and isolation products. The required creepage distance, as stated in IPC2221A, is determined by the voltage difference between the two conductors, the pollution degree in which the isolation circuit will be used, and the insulation material. This requirement is set to prevent electrical breakdown on the surface of the insulating material (a large voltage differential creates a conductive leakage path across the insulating surface) and arcing which results in IC performance degradation. The distance requirement often exceeds the standard pin to pin pitch of a JEDEC package.

One solution is to use a leadframe for the IC in which one or more pins are depopulated in order to increase the distance between the remaining pins. Another solution is to use a larger package and leadframe for the IC that has a greater pin to pin pitch distance.

BRIEF DESCRIPTION OF THE DRAWINGS

Particular embodiments in accordance with the invention will now be described, by way of example only, and with reference to the accompanying drawings.

Figure 1:
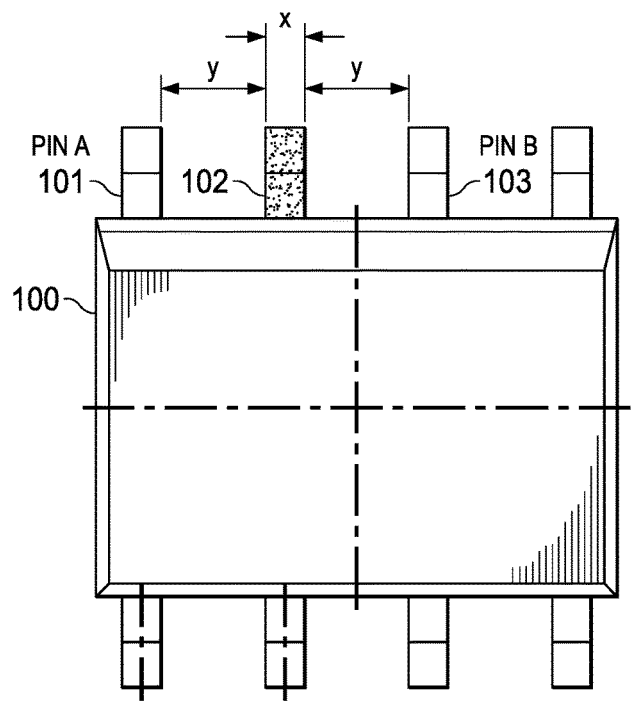
FIG. 1 is a top view of an IC in which an unused pin of the leadframe has been coated.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

As is disclosed herein, the required creepage distance issue may be addressed by using an additive deposition method such as inkjet printing, screen printing or electrostatic spraying to coat a film of insulating ink over the surface of one or more external pins in order to increase the effective creepage distance between two active pins. In this manner, electrical breakdown on the surface of the insulating material between the two active pins may be prevented. Embodiments of this disclosure may help to reduce the cost and improve the product development cycle of high voltage (HV) IC packages.

As mentioned previously, one solution to the problem is to use a leadframe for the IC in which one or more pins are depopulated in order to increase the distance between the remaining active pins. High voltage packages often depopulate pin(s) with a new lead frame design and tooling to meet the creepage requirements by increasing the distance between two conductors and allowing the molding compound to cover or fill the depopulated lead location to meet creepage requirements. However, this may be an expensive solution; for example, tooling to produce a modified leadframe may cost in the range of $100 k-$300 k.

A better solution will now be disclosed in more detail. An additive deposition method such as inkjet printing, screen printing or electrostatic spraying may be used to coat a film of insulating ink over the surface of one or more external pins. The ink may be comprised of a polymer in solution, or in monomer form such as an epoxy, polyimide, Bismaleimide, PBO, or one of many other high voltage capable polymers. The ink may also be comprised of nanomaterial insulators in a dispersion such as nano-oxides which have a binder within the dispersion to aid in adhesion to the designated one or more pins of the leadframe. Many other materials may be deposited using this method, such as: ceramics, organics, and inorganics which are insulating and have a high breakdown voltage, or in other words have a high dielectric strength.

FIG. 1 is a top view of an IC 100 in which one pin 102 of the leadframe has been coated by printing a dielectric ink onto it. The printed ink which has coated lead finger 102 increases the creepage distance without needing to remove pin 102. For example, assuming distance y is 0.5 mm, and the width x of pin 102 is 0.25 mm, then the creepage distance between pins 101 and 103 with pin 102 coated with isolating material=0.5+0.5+0.25=1.25 mm. On the other hand, the creepage distance between pins 101 and 103 without the isolating material on pin 102=0.5+0.5=1.00 mm.

The coating process may be done while the individual leadframes/ICs are still together in a strip or panel. Alternatively, the coating process may be done to individual IC units. The coating process may be applied to essentially any type of leadframe, such as an Ag Spot Copper lead frame, a Pre-Plated NiPdAu lead frame, etc.

Figure 2:
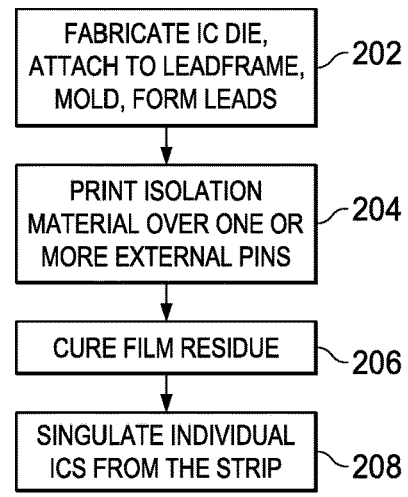
FIG. 2 is flow diagram illustrating a process flow for coating one or more pins of an IC.

FIG. 2 is flow diagram illustrating an example process flow for coating one or more pins of an IC. Initially 202, the ICs are fabricated and attached to the leadframe, molded, and the external pins formed, using known or later developed fabrication techniques. At this point, the units may still be in strip form.

After molding and forming, isolation material ink may be printed 204 over one or more external pins, such as pin 102, referring back to FIG. 1. An additive deposition method such as inkjet printing, screen printing or electrostatic spraying may be used to coat a film of insulating ink over the surface of one or more external pins. The ink may be comprised of a polymer in solution, or in monomer form such as an epoxy, polyimide, Bismaleimide, PBO, or one of many other high voltage capable polymers. The ink may also be comprised of nanomaterial insulators in a dispersion such as nano-oxides which have a binder within the dispersion to aid in adhesion to the designated one or more pins of the leadframe. Many other materials may be deposited using this method, such as: ceramics, organics, and inorganics which are insulating and have a high breakdown voltage, or in other words have a high dielectric strength.

Fabrication of three dimensional structures using ink jet printers or similar printers that can "print" various polymer materials is well known and need not be described in further detail herein. For example, see "3D printing," Wikipedia, Sep. 4, 2014. Printing allows for the rapid and low-cost deposition of thick dielectric and metallic layers, such as 0.1 um-1000 um thick, for example, while also allowing for fine feature sizes, such as 20 um feature sizes, for example.

The film residue that is left from the ink may then be cured 206 in the case of solvent or dispersant based ink where solvent or dispersant is evaporated. Curing may be thermal (50-250 C), UV, Infrared, Flash Lamp, or of another form that is compatible with the ink being used.

The completed units may then be singulated 208 from the strip level using known or later developed techniques, such as cutting or stamping, for example.

Figure 3:
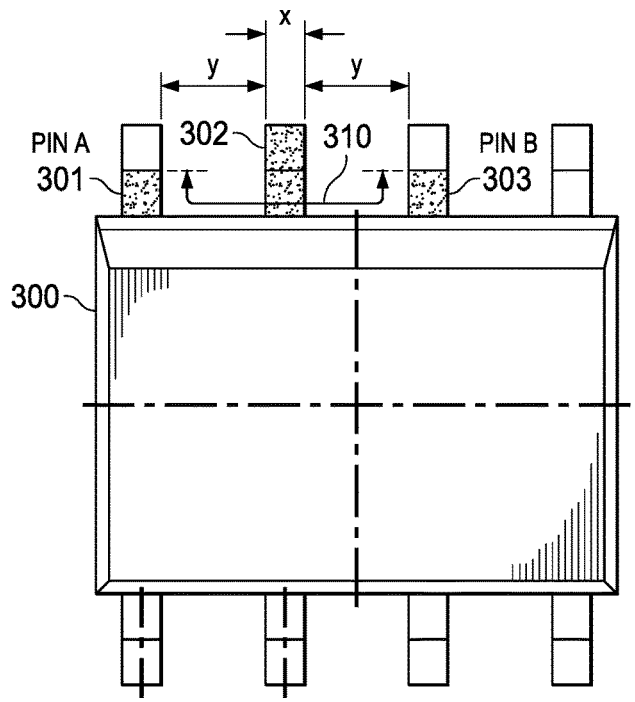
FIG. 3 is a top view of an IC in which several pins of the leadframe have been partially coated.

FIG. 3 is a top view of an IC 300 in which several pins of the leadframe have been partially coated. In this example, a partial coating has been applied to pin 301 and 303, while pin 302 is fully coated. In this case, the creepage distance 310 may be increased by the length of each coated portion of pins 301, 303, while leaving the ends of pins 301, 303 clean so that they may be coupled to contacts on a substrate, such as a printed circuit board.

Figure 4A:
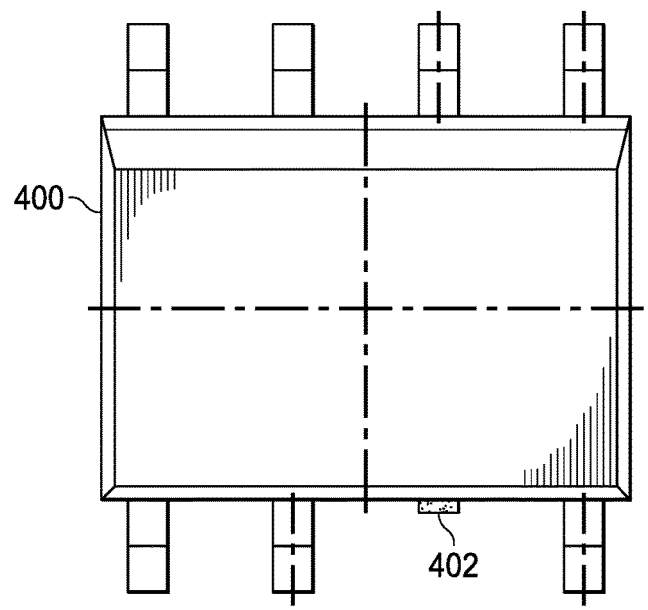
FIGS. 4A-4C include multiple views of an IC in which a trimmed pin has been coated.
Figure 4B:
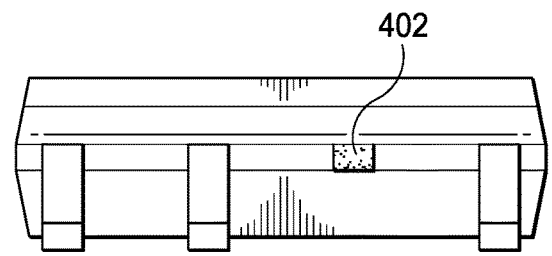
Figure 4C:
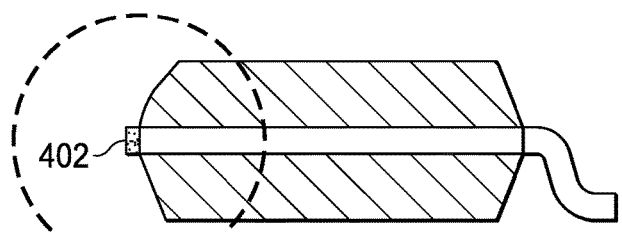

FIG. 4A-4C includes multiple views of an IC 400 in which a trimmed pin 402 has been coated. In this embodiment, an isolating film ink is printed over the exposed conductive surface after the pin has been depopulated from the package.

In this embodiment, the process flow may be as follows. After molding, pin(s) is depopulated from the package by a trim and form process, using known trim and forming techniques. After trimming and forming, isolation material ink may be printed over the external pin stub 402. Any film residue that is left from the ink (in case of solvent or dispersant based ink where solvent or dispersant is evaporated) may then be cured. Curing can be thermal (50-250 C), UV, Infrared, Flash Lamp, or of another form. The units are then singulated from the strip level.

Figure 5:
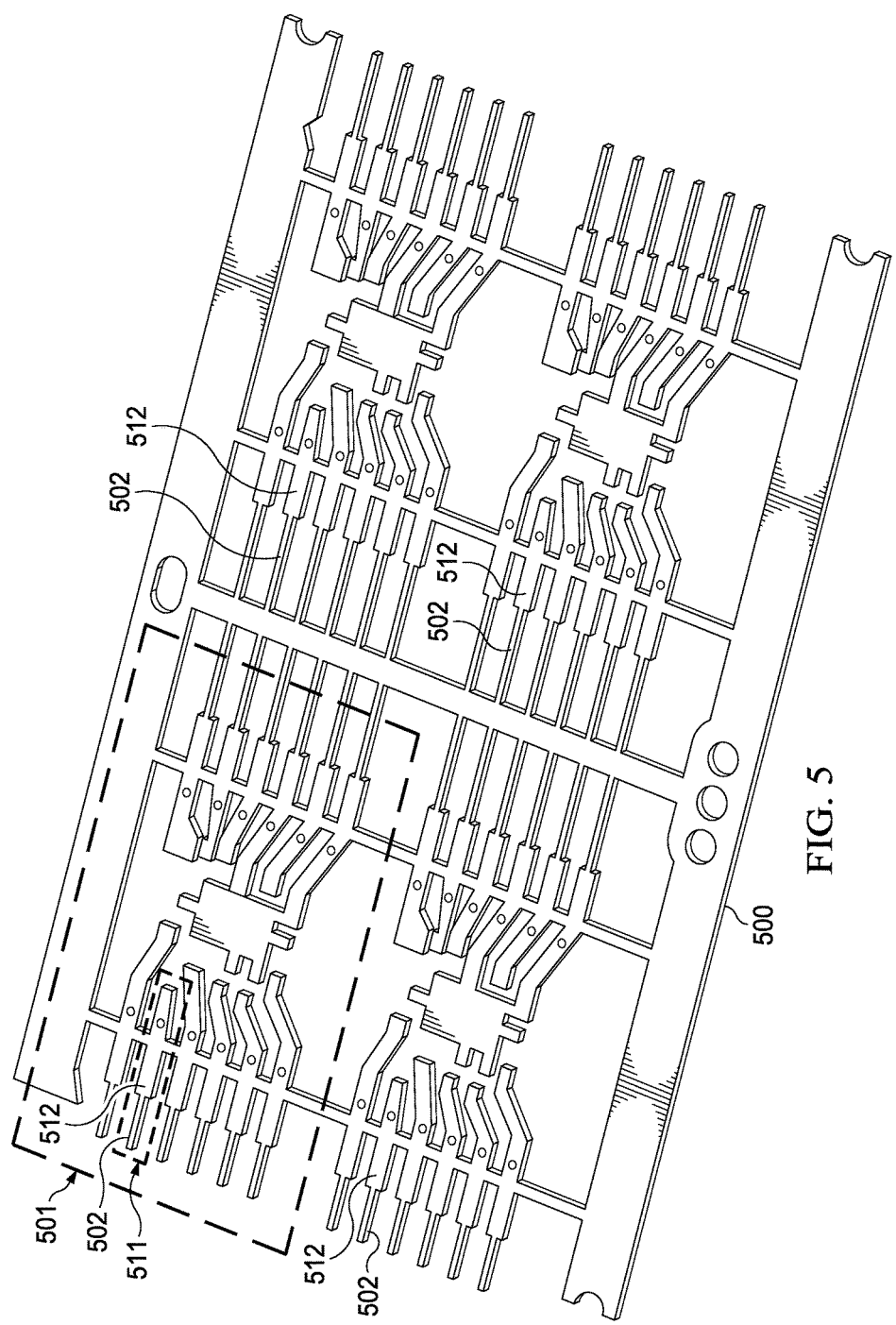
FIG. 5 is an illustration of a portion of a leadframe strip.

FIG. 5 is an illustration of a portion of a leadframe strip 500 that illustrates four repetitions of a leadframe 501. Each leadframe 501 includes a set of leads, such as lead 511, that transition into a corresponding set of pins, such as pin 502. In another embodiment, the creepage issue may be solved by printing the isolating film ink over the exposed conductive surface of one or more selected pins of a leadframe before molding, such as each pin 502. All or a portion of the associated lead, such as 512 may also be coated. This provides additional insulation of the pin and lead inside the molded package. In this case, after encapsulation the coated pin may be left, similar to pin 102 of FIG. 1, or it may be trimmed in a similar manner as pin 402 in FIG. 4. A second coating step may be performed to coat the stub if the pin is depopulated, such as described with regard to FIG. 4.

System Example

Figure 6:
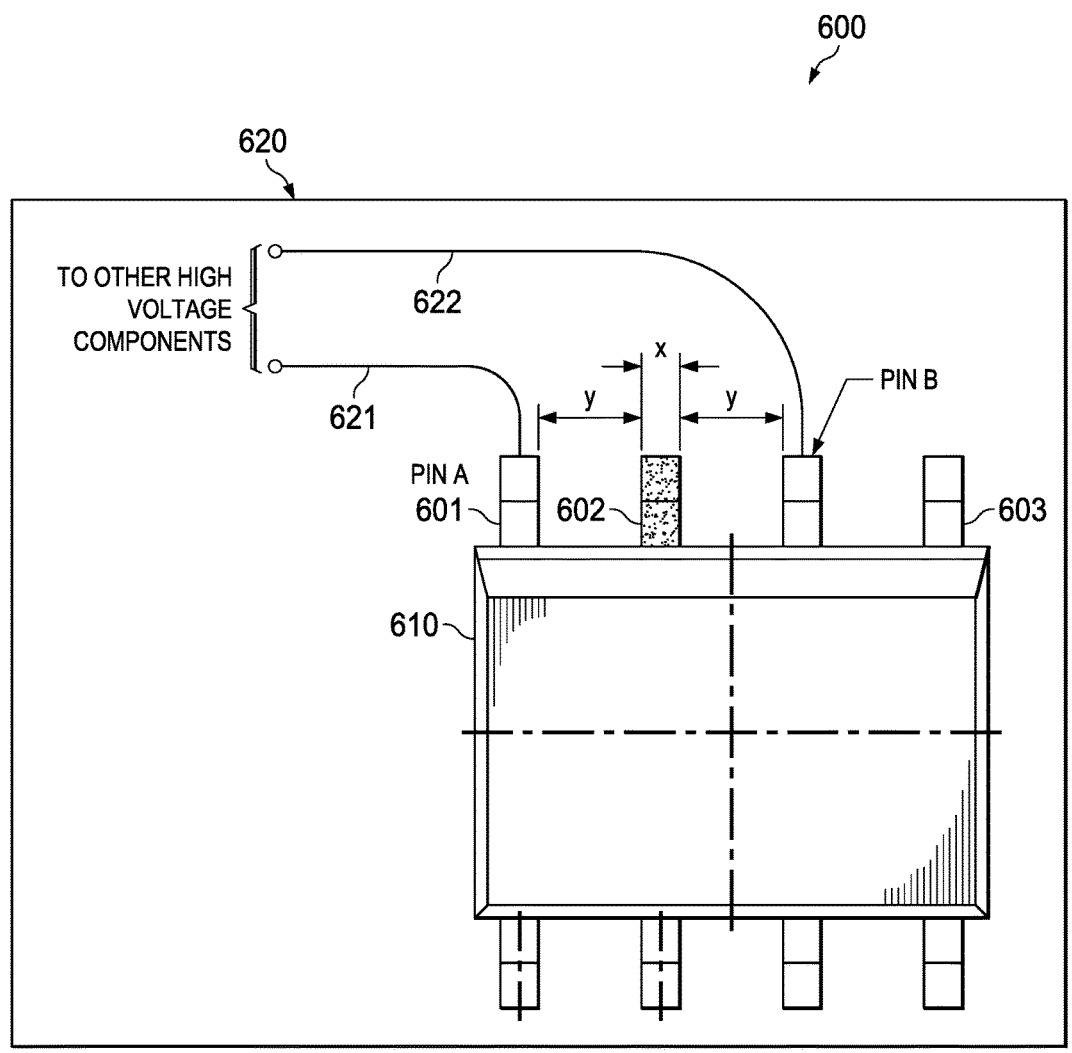
FIG. 6 illustrates a system with an IC mounted on a substrate.

FIG. 6 illustrates a system 600 with an IC 610 mounted on a substrate 620. In this example, substrate 620 may be a fiberglass printed circuit board, a ceramic circuit board, or any other known or later developed type of single layer or multilayer system substrate on which are formed various signal traces, such as traces 621, 622. In this example, IC 610 is similar to IC 100 of FIG. 1. Pin 602 is coated to increase the creepage distance between pin 601 and 603, as described above in more detail.

Pins 601 and 602 may be coupled to signal traces 621, 622 that are located on substrate 620 in order to conduct a high voltage signal between IC 610 and other high voltages components (not shown) that are included in system 600. Typically, IC 610 may be coupled to a contact portion of each trace by soldering; however other known or later developed coupling techniques may be used.

Note, in this example since pin 602 is totally coated by a dielectric coating, it will typically not be connected to a signal contact on substrate 620. However, in another example, a partially coated pin, such as pins 301, 303 (referring again to FIG. 3) may be coupled to a contact portion of a signal trace on a substrate.

OTHER EMBODIMENTS

While the invention has been described with reference to illustrative embodiments for coating a leadframe pin using an additive process, this description is not intended to be construed in a limiting sense. Various other embodiments of the invention will be apparent to persons skilled in the art upon reference to this description. For example, other uses besides high voltage isolation may be accomplished with embodiments of the additive process described herein. For example, coating one or more pins of an IC may be used to change a dielectric constant around the leadframe pin for radio frequency (RF) applications, such as to provide better matching for a transmission line or radio antenna.

In another embodiment, coating of one or more pins of an IC using an additive process may be used to increase the adhesion of mold compound to the leadframe.

In another embodiment, coating of one or more pins of an IC using an additive process may be used to prevent oxidation of the lead frame pins in place of gold plating, for example.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A package comprising:
   a semiconductor die including contacts;
   at least first and second leads attached to respective ones of the contacts;
   encapsulating material enclosing the semiconductor die, such that: at least a portion of the first lead extends beyond the encapsulating material; and at least a portion of the second lead extends beyond the encapsulating material; and
   an additive insulating coating covering every portion of the first lead that extends beyond the encapsulating material.

2. The package of claim 1, wherein the additive insulating coating covers every portion of the second lead that extends beyond the encapsulating material.

3. The package of claim 1, wherein the additive insulating coating is selected from a group consisting of: epoxy, polyimide, Bismaleimide, and PBO.

4. The package of claim 1, wherein the leads are trimmed to form stubs, and wherein the stubs are covered by the additive insulating coating.

5. The package of claim 1, wherein the semiconductor die is mounted on a substrate.

6. A method of forming a package, the method comprising:
   forming at least first and second leads attached to respective ones of contacts of a semiconductor die;
   encapsulating the semiconductor die with encapsulation material, such that: at least a portion of the first lead extends beyond the encapsulating material; and at least a portion of the second lead extends beyond the encapsulating material; and
   adding an insulating coating to cover every portion of the first lead that extends beyond the encapsulating material.

7. The method of claim 6, wherein the insulating coating covers every portion of the second lead that extends beyond the encapsulating material.

8. The method of claim 6, wherein the insulating coating is selected from a group consisting of: epoxy, polyimide, Bismaleimide, and PBO.

9. The method of claim 6, wherein adding the insulating coating is performed after encapsulating the semiconductor die.

10. The method of claim 6, wherein adding the insulating coating is performed before encapsulating the semiconductor die.

11. The method of claim 6, wherein adding the insulating coating is performed before attaching the leads to corresponding ones of the contacts.

12. The method of claim 6, wherein adding the insulating coating is performed by an inkjet process.

13. The method of claim 6, wherein adding the insulating coating is performed by an electrostatic process.

14. The method of claim 6, wherein adding the insulating coating is performed by a silk screen process.

15. The method of claim 6, further including:
   trimming the leads to form stubs, wherein the insulating coating covers the stubs.

16. The package of claim 1, wherein the additive insulating coating covers less than every portion of the second lead that extends beyond the encapsulating material.

17. The method of claim 6, wherein the insulating coating covers less than every portion of the second lead that extends beyond the encapsulating material.

* * * * *